United States Patent [19]
Ligertwood

[11] Patent Number: 5,467,141
[45] Date of Patent: Nov. 14, 1995

[54] MODULATOR CIRCUIT FOR USE WITH A PLURALITY OF OPERATING STANDARDS

[75] Inventor: Peter J. Ligertwood, Geneva, Switzerland

[73] Assignee: Motorola, Inc., Schaumburg, Ill.

[21] Appl. No.: 129,037

[22] PCT Filed: Feb. 18, 1993

[86] PCT No.: PCT/EP93/00391

§ 371 Date: Oct. 12, 1993

§ 102(e) Date: Oct. 12, 1993

[87] PCT Pub. No.: WO93/17522

PCT Pub. Date: Sep. 2, 1993

[30] Foreign Application Priority Data

Feb. 20, 1992 [GB] United Kingdom ............... 9203587
Dec. 3, 1992 [GB] United Kingdom ............... 9225292

[51] Int. Cl.⁶ ...................................... H04N 5/40
[52] U.S. Cl. ........................... 348/555; 348/724
[58] Field of Search ........................ 348/555, 642, 348/723, 724, 558; H04N 5/40

[56] References Cited

U.S. PATENT DOCUMENTS 4,511,915  4/1985  Van der Valk et al. ............. 348/642 X
4,962,428  10/1990  Tong et al. ........................... 348/555
5,079,525  1/1992  Ishikawa et al. ..................... 348/724 X

FOREIGN PATENT DOCUMENTS 0432052  6/1991  European Pat. Off. ......... H04N 5/40

*Primary Examiner*—Victor R. Kostak
*Attorney, Agent, or Firm*—Rennie William Dover

[57] ABSTRACT

This invention relates to a modulator circuit (2) for a video system such as a VCR. The modulator circuit (2) is selectably operable in any one of a plurality of modes of operation in order to comply with the operating standard of the video system. The modulator circuit comprises oscillator circuit (4, 10) for generating a carrier signal having a selectably variable frequency, and a modulating circuit (3) coupled to receive the carrier signal and having an audio input (24) for receiving an audio signal and a video input (26) for receiving a video signal, the modulating circuit using the video and audio signals to generate a modulated output signal on the carrier signal, the generation of the modulated output signal depending on selectably variable operating parameters of the modulating circuit. The modulator circuit further comprises control circuit (5, 6, 20) coupled to the oscillator circuit (4, 10) and to the modulating circuit (3), for receiving a mode select signal (SCL, SDA) and for selecting the frequency of the carrier signal and for selecting predetermined values for the variable operating parameters of the modulating circuit in dependence on the mode select signal whereby the modulated output signal is generated in accordance with one of the plurality of modes of operation.

11 Claims, 2 Drawing Sheets

MODULATOR CIRCUIT FOR USE WITH A PLURALITY OF OPERATING STANDARDS

This invention relates to modulator circuits and more particularly to audio/video modulator circuits.

BACKGROUND OF THE INVENTION

Modulators are extensively used in consumer products such as VCRs, satellite receivers, camcorders or similar video systems to couple received audio and video signals to a display unit such as a TV receiver. The basic function is to take inputs of base-band composite video and audio, and to modulate a RF carrier such that a TV receiver can tune to this signal.

There are a number of different video standards used around the world. For example, in Europe there exists PAL B/G, PAL I, SECAM L and SECAM B/G. Each standard has an unique specification which must be met by the video system and hence the modulator of the system. This means that a PAL VCR requires a modulator having different operating parameters to that of a modulator of a SECAM VCR. These parameters include O/P channel number, modulation depth, audio (sound) carrier frequency. A manufacturer supplying the European video market must therefore make different versions of modulators for the different video standards: each version designed to serve a specific video system.

Multi-standard modulators have now been designed in order to avoid the need to produce many different versions of modulators. These multi-standard modulators can operate in two or more different systems when fitted with appropriate external components. These modulators employ either fixed, selected, components or potentiometer/trimmer controls for adjusting parameters in order to meet a certain standard's specification.

In order to provide multi-standard capability, the known modulator circuits use a significantly large mount of extra hardware and external switching. For example, the audio carrier frequency of a modulator is determined by the values in an external L-C tank circuit. A multi-standard modulator must provide three or more audio carriers and thus requires at least three of such L-C tanks. In addition to the disadvantages associated with extra hardware, each of the tank circuits require factory set up and external switching to the appropriate standard. This is time consuming which increases production costs.

Trimming adjustments of modulator parameters, such as audio and video depth, picture/audio carrier ratio, are factory set using either manual potentiometers or SOT (Select-On-Test) components. Such manual adjustments are time consuming and subject to operator error. Furthermore, with multi-standard modulators, it is often necessary to further vary these parameters in order to meet the requirements of a specific standard, in which case additional externally controlled switching is required.

In summary, the known multi-standard modulators avoid the need to produce different types of modulators for the different standards and thereby increase the flexibility for the manufacturer. However, the known multi-standard modulators are more complex circuits requiring additional components and manual adjustments which increases the size and production costs for such modulators.

SUMMARY OF THE INVENTION

It is therefore an object of the present invention to provide an improved modulator circuit that overcomes the above described problems.

In accordance with the present invention there is provided a modulator circuit for a video system, the modulator circuit being selectably operable in any one of a plurality of modes of operation, and comprising:

oscillator means for generating a carrier signal having a selectably variable frequency;

modulating means coupled to receive the carrier signal and having an audio input for receiving an audio signal and a video input for receiving a video signal, the modulating means using the video and audio signals to generate a modulated output signal on the carrier signal, the generation of the modulated output signal depending on selectably variable operating parameters of the modulating means;

control means coupled to the oscillator means and to the modulating means, for receiving a mode select signal and for selecting the frequency of the carrier signal and for selecting predetermined values for the variable operating parameters of the modulating means in dependence on the mode select signal whereby the modulated output signal is generated in accordance with one of the plurality of modes of operation.

An advantage of the modulator circuit in accordance with the present invention is that one modulator circuit can be used for several different video systems supporting different video standards. Thus, a semiconductor manufacturer need make only one version of a modulator circuit to supply the European market. Unlike known multi-standard video systems, the present invention does not require different external components for the different standards. Furthermore, the control means can simply perform trimming adjustments which in the prior art circuits can only be performed manually or with SOT components.

Preferably, the control means comprises data storage means for storing a different set of data for each of the plurality of modes of operation, each set comprising information representing the frequency of the carrier signal and the predetermined values for the variable operating parameters of the modulating means, and a control bus which couples the data storage means to the oscillator means and the modulating means, wherein the control bus in response to the mode select signal communicates the selected set of signals representative of the carrier signal frequency and the predetermined values to the oscillator means and the modulating means respectively.

Each modulator has an RF oscillator whose frequency is also determined by an external L-C tank circuit. This is normally supplied with a trimmer capacitor which enables the end user to choose a channel over a limited range, which channel does not cause interference with existing programmes. Due to channel crowding and the proliferation of other video equipment these arrangements are becoming inadequate. Hence some modulators now employ a separate tuning Phase Lock Loop (PLL) to synthesise a much wider number of channels. These PLL circuits are normally controlled via a MCU bus such as an I$^2$C bus.

In the modulator circuit in accordance with the present invention, the tuning PLL and the modulator circuit are incorporated into one device. The PLL channel selection is controlled via the control means and the control bus.

BRIEF DESCRIPTION OF THE DRAWING

A modulator circuit in accordance with a preferred embodiment of the invention will now be described, by way of example only, with reference to the accompanying drawings in which.

DETAILED DESCRIPTION OF THE PREFERRED EMBODIMENT

Figure 1:
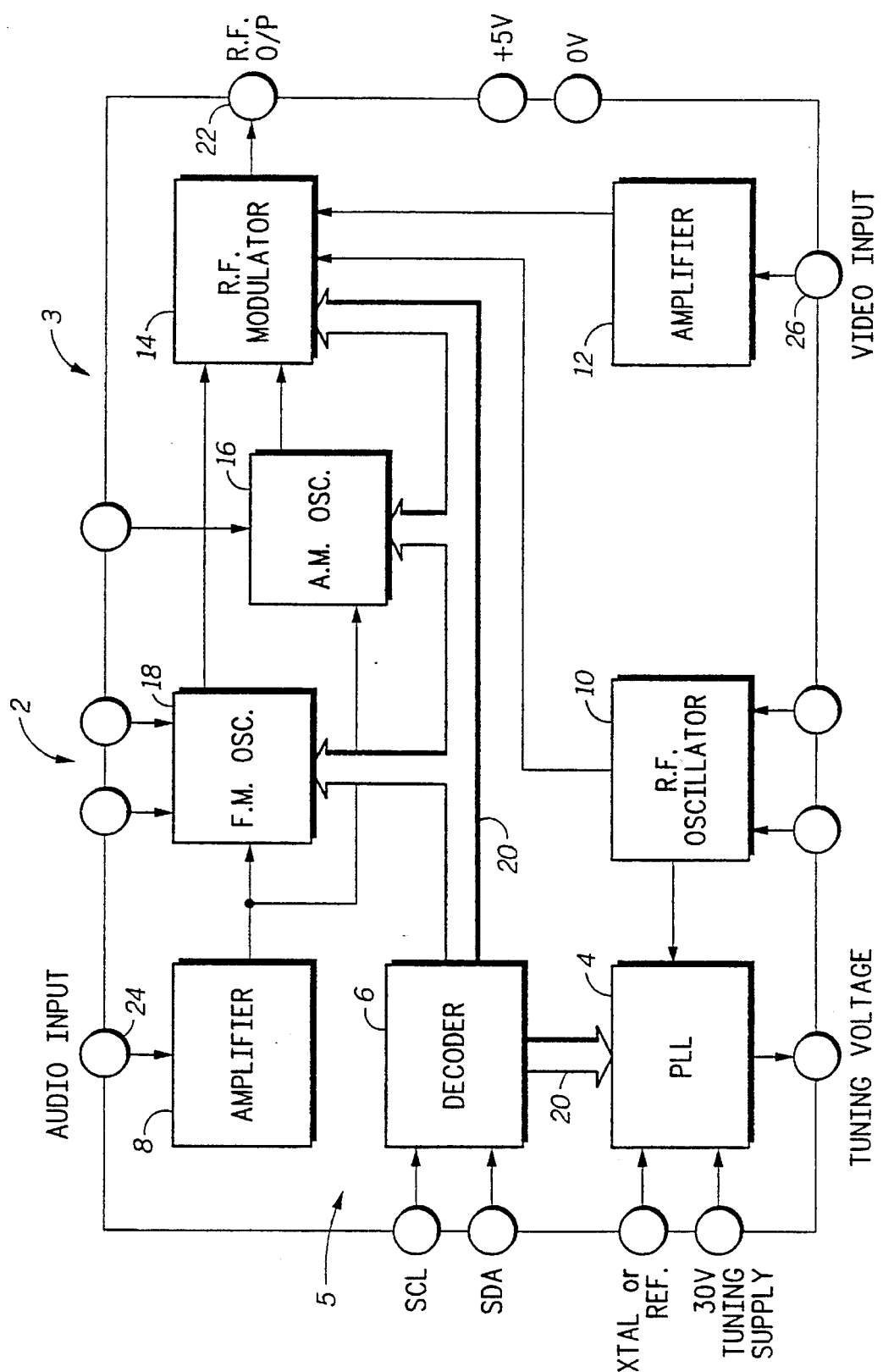
FIG. 1 shows a simplified block schematic diagram of a modulator in accordance with the present invention.

Referring firstly to FIG. 1, a modulator 2 in accordance with a preferred embodiment of the present invention comprises an oscillator section 10 and 4, a modulator section 3 and a control section 5. The oscillator section comprises an on-chip tuning PLL 4 for tuning the channel frequency of a RF output 22. The modulator section 3 accepts audio and video signals received at inputs 24 and 26 respectively and modulates the tuned RF output signal with the audio and video signals. The control section 5 comprises a decoder 6 coupled to receive mode select control signals at inputs SDA and SCL and to a control bus 20 which is coupled to the PLL 4 and to the modulator section 3.

The modulator section 3 comprises an amplifier 8 coupled to receive the audio input signal at input 24 and an amplifier 12 coupled to receive the video input signal at input 26. An output of amplifier 8 is selectively coupled to a FM oscillator 18 or an AM oscillator 16. The selection of either the FM oscillator 18 or the AM oscillator 16 is determined by the signals on the control bus 20. The selected oscillator 16 or 18 modulates a carrier signal with the received audio signal and provides an audio modulated signal to the RF modulator 14.

The received video signal is fed via amplifier 12 to an input of RF modulator 14. RF modulator 14 amplitude modulates a tuned RF carrier signal with the received audio modulated signal and video signals to provide the RF output signal at RF output 22. The tuned RF carrier signal at the selected channel is derived from RF oscillator 10 and PLL 4. The modulation is negative (sync tip at peak carrier level) except in system L where positive modulation is used.

The modulator 2 is a multi-standard modulator and can operate according to a number of different standards. In the preferred embodiment, the modulator 2 can operate in any one of the standards PAL (G, I) and SECAM (D,K,L). The control section 5, in response to signals on the inputs SCL and SDA from a microprocessor, selects one of the standards and controls certain operating parameters of the modulator 2, such as channel frequency, audio carrier frequency, audio/video modulation index and audio/picture (P/S) carrier ratio, in accordance with the selected standard via the control bus 20. The value of these certain operating parameters determine the standard to which the modulator 2 operates.

The operation of the multi-standard modulator 2 will be described in more detail below.

Decoder 6 comprises memory registers (not shown) for storing predetermined values for certain operating parameters. In the preferred embodiment, on start-up, reset or periodic refresh, the contents of the memory registers are programmed with data received from the processor via inputs SCL and SDA. The data is in digital form and is converted to control signals via D/A converters or simple switches which control signals are outputted on the control bus 20 to set the desired functions or levels in the modulator. Control signals may also be generated during normal operation to change an operating parameter.

Preferably, the data is in the form of a look-up table. For each standard supported by the modulator, a set of predetermined values for certain operating parameters are stored. In use, when a specific standard is selected via signals on the SCL and SDA inputs, the set of operating values for the selected standard are read from the look-up table and outputted onto the control bus so as to set the corresponding operating parameters to the selected standard. Preferably, one of the standards is defined as a default configuration so that at power-on of the modulator 2, the device will operate according to the default standard without the use of the control bus 20. In this mode one RF channel only will be preset. A possible default standard is shown in Table 1.

TABLE 1

| Standard | PAL B/G |
| --- | --- |
| RF Channel | 36 |
| Audio Carrier | 5.5 MHz |
| P/S ratio | 14 dB |
| Video Modulation | 80% |
| Audio Modulation | 100% FM(=50 KHz deviation) |

For the modulator circuit in accordance with the invention, any one of a plurality of standards may be selected. Preferably, on power up the modulator will always wake up in the same standard, and as mentioned above, data will be refreshed periodically to maintain this standard. Normally when the equipment (VCR or satellite receiver) is installed in the end user's home, one standard only is permanently maintained. However, the present invention ensures that it is possible for the end user or retailer to configure the modulator circuit to any of the available standards at any time via the control bus. This provides advantages when the equipment incorporating the modulator is to be exported to different countries having different standards.

Figure 2:
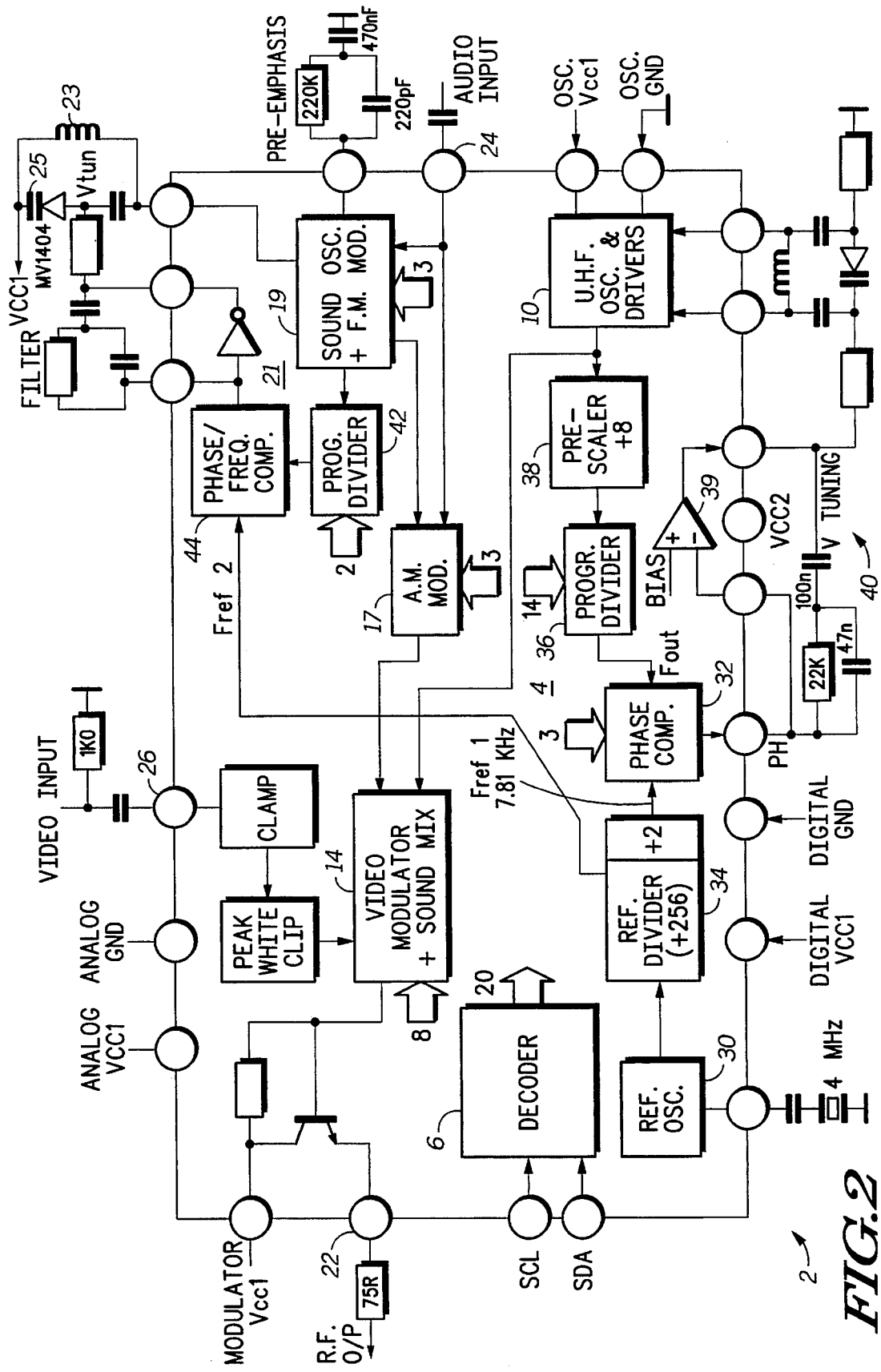
FIG. 2 shows a more detailed diagram of the modulator of FIG. 1.

FIG. 2 shows a more detailed diagram of the modulator circuit 2 in accordance with a preferred embodiment of the present invention. The same components to those of FIG. 1 are referred to by the same reference numeral.

The tuning PLL 4 comprises a reference oscillator 30 which provides a reference signal Fref1 to a phase comparator 32 via a reference divider 34. The phase comparator 32 also receives a divided down frequency ($F_{out}$) from a programmable divider 36. The output PH of the phase comparator is fed to an inverting amplifier 39 to provide a high level of tuning voltage $V_{TUNING}$ (up to 30 V). The filtered tuning voltage is used to vary the capacitance of varicap diode (41), which in turn determines the frequency of oscillation of the RF oscillator 10 thereby closing the tuning PLL loop. The output of the RF oscillator is fed to the RF modulator 14 to be used by the modulator as the TV channel carrier signal and to an input of the programmable divider 36 via a prescaler 38. The RF oscillator 10 is arranged to oscillate over a range of 450 to 900 MHz and is tuned under the control of the PLL 4 via the external L-C circuit 40. The programmable divider's 36 division ratio is controlled by the state of control bits N0 to N13 sent from decoder 6 via the control bus 20. Thus, the RF channel selection can be controlled by controlling the state of the bits N0 to N13.

The reference divider 34 preferably divides by 512 resulting in a reference frequency of 78125 Hz with a 4 MHz crystal. The frequency of the RF oscillator 10 may be synthesised in steps of 62.5 KHz.

The audio modulator system of the preferred modulator section 3 consists of a FM modulator 19 incorporating the audio carrier oscillator and an AM modulator 17. The audio input at input 24 is ac coupled into the amplifier 8 which then drives the two types of modulators 17 and 19.

In order to provide the accuracy needed for the audio carrier frequencies, the audio oscillator 19 consists of a second PLL 21 and an external L-C circuit 23. The frequency of the audio oscillator 19 is controlled via a varicap tuning diode 25. The resulting oscillator frequency is divided down by a programmable divider 42 whose ratio is controlled by a two bit control signal on the control bus 20. A phase/frequency comparator 44 then compares the signal outputted from the programmable divider 42 with a reference frequency Fref2 obtained from the reference divider 34 of the tuning PLL 4. The resulting error voltage is used to control the varicap. The oscillator provides carrier frequencies of 4.5, 5.5, 6.0 and 6.5 MHz selectable via the control bus 20.

The PLL 21 provides an accurate centre frequency carrier which is then modulated by the audio signal at input 24. For all standards, except system L, the audio carrier is frequency modulated with the audio signal using the FM modulator 19. In this FM mode, the AM modulator 17 is disabled via the control bus 20. System L, however, utilises amplitude modulation and hence the amplitude modulator 17 is enabled and the FM modulator is disabled via the control bus 20. For AM modulation, the quadrature currents driving the FM modulator are switched off and the accurate centre frequency carrier is passed to the amplitude modulator 17.

Prior art multi-standard modulator circuits utilise a L-C audio carrier oscillator to provide the audio carrier signal. However, as described above in order to provide a number of different carrier frequencies separate L-C tank circuits must be used together with means to switch between the two or more circuits to provide the different frequencies. Furthermore, each of the different frequencies required for the different standards need manual adjustment which is unwieldy. The present invention overcomes this problem by employing the second PLL 21 to accurately generate the audio carrier centre frequencies which are selectable via the two bit control signal on the control bus 20. The frequency can simply and easily be selected by changing the PLL division ratio via the control bus 20. Thus, the present invention allows for audio carrier frequency selection using only one L-C tank and no external switching.

The operating parameters which, in the preferred embodiment, are placed under bus control include: channel frequency, video modulation depth, audio modulation depth, picture to audio carrier ratio, audio carrier frequency, and system L selection. The control of these parameters will be described in more detail below.

The channel frequency is selected via programmable divider 36 of the PLL 4 and RF oscillator 10.

In order to control the video modulation depth, a three bit control signal is sent from the decoder 6 to the RF modulator 14. The three bit control signal defines eight preset positions of adjustment of the percentage level of video modulation depth at the RF output 22. The modulation depth remains valid for either positive or negative going modulation. For PAL, the video modulation depth may vary from a minimum 69.5% to a maximum 93.5%. For SECAM, the video modulation depth may vary from a minimum 72.5% to a maximum 99%. Prior art modulators make such an adjustment using potentiometer factory set up.

In order to control the audio modulation depth, a three bit control signal is sent from the decoder 6 to the selected FM 18 or AM 16 oscillator. The three bit control signal defines eight preset positions of adjustment of the depth of modulation of the audio carrier frequency. This refers to the modulation of the audio carrier by the audio input and is a deviation (max. 50 KHz) in the case of FM modulation and a percentage (max. 85%) in the case of AM modulation. In prior art modulators, this parameter is typically a factory set component and which, once set, is nonadjustable. Since the present invention provides for adjustment of the audio modulation depth during use, the modulator 2 in accordance with the present invention allows increased flexibility of operation.

The audio and video modulation depth is typically controlled using a balanced multiplier. For amplitude modulation, a base band signal is multiplied together with a carrier frequency; this may be the RF carrier. The depth of modulation can be varied by varying the level of the base band signal.

In order to control the picture to audio carrier (P/S) ratio, a three bit control signal is sent from the decoder 6 to the RF modulator 14. The three bit control signal defines eight preset positions of adjustment of the level of the audio carrier relative to the picture carrier at the RF output 22 of the modulator 2. The ratio may vary from −18.5 dB to −8.5 dB. In prior art modulators, this parameter is typically a factory set component and which, once set, is non-adjustable.

As discussed above, the audio carrier frequency is selectable via a two bit control signal on the control bus 20.

Similarly, the selection between AM and FM and positive and negative audio modulation is also controlled via the signals on the control bus 20 and thereby obviates the need for additional external hardware, such as external pin switching, for such selection. Thus, the control bus 20 is used to enable System L (used for French TV broadcast) which requires the use of positive RF modulation and also amplitude modulation of the audio carrier.

The modulation depth and carrier ratio adjustments are also controlled via the control bus 20. Thus, the potentiometer and other manual interventions required during factory set up can be avoided entirely. Furthermore, trimming adjustments which are desirable when changing to different systems can be achieved simply by using some simple software and the control bus 20.

In the preferred embodiment the control bus 20 operates with I²C data format. It will be appreciated that other formats may be implemented such as a 3-wire bus format.

I claim:

1. A modulator circuit for a video system, the modulator circuit being selectably operable in any one of a plurality of modes of operation corresponding to different video standards, and comprising:

oscillator means for generating a carrier signal having a selectably variable frequency;

modulating means coupled to receive the carrier signal and having an audio input for receiving an audio signal and a video input for receiving a video signal, the modulating means using the video and audio signals to generate a modulated output signal on the carrier signal, the generation of the modulated output signal depending on selectably variable operating parameters of the modulating means;

control means coupled to the oscillator means and to the modulating means, for receiving a mode select signal and for selecting the frequency of the carrier signal and for selecting predetermined values for the variable operating parameters of the modulating means in dependence on the mode select signal, wherein the control means comprises:

data storage means for storing a different set of data for each of the plurality of modes of operation, each set comprising information representing the frequency of the carrier signal and the predetermined values for the variable operating parameters of the modulating means; and a control bus which couples the data storage means to the oscillator means and the modulating means, wherein the control bus in response to the mode select signal communicates the selected set of signals representative of the carrier signal frequency and the predetermined values to the oscillator means and the modulating means respectively, whereby the modulated output signal is generated in accordance with one of the plurality of modes of operation.

2. A modulator circuit according to claim 1 wherein the oscillator means comprises:

a Phase Lock Loop (PLL) for providing a frequency control signal to a RF oscillator which generates the carrier signal in dependence thereon, the level of the frequency control signal being controlled by the control means whereby the frequency of the carrier signal is selected by the control means.

3. A modulator circuit according to claim 1 wherein the modulating means comprises:

an audio modulator coupled to the audio input and having audio oscillator means for generating an audio carrier signal, the audio modulator using the received audio signal to modulate the audio carrier signal to provide a modulated audio signal; and a RF modulator coupled to the video input and to the audio modulator, the RF modulator using the video signal and modulated audio signal to modulate the carrier signal to generate the modulated output signal.

4. A modulator circuit according to claim 3 wherein the audio modulator comprises a FM circuit and an AM circuit, the control means selecting either one of the FM or AM circuits in dependence on the selected mode of operation so as to provide either an FM modulated audio signal or an AM modulated audio signal.

5. A modulator circuit according to claim 3 wherein the oscillator means comprises a PLL for generating the audio carrier signal having a selectably variable frequency, and wherein the frequency of the audio carrier signal is selected by the control means in dependence on the selected mode of operation.

6. A modulator circuit according to claim 1 wherein the operating parameters include any one of the following:

carrier signal frequency;

video modulation depth;

audio modulation depth;

picture to audio carrier ratio; or audio carrier frequency.

7. A modulator circuit according to claim 1 wherein the modulator circuit is integrated in an integrated circuit.

8. A modulator circuit for a video system, the modulator circuit being selectably operable in any one of a plurality of modes of operation corresponding to different video standards, and comprising:

oscillator means for generating a carrier signal having a selectably variable frequency, the oscillator means comprising a Phase Lock Loop (PLL) for providing a frequency control signal to a RF oscillator which generates the carrier signal in dependence thereon;

modulating means coupled to receive the carrier signal and having an audio input for receiving an audio signal and a video input for receiving a video signal, the modulating means using the video and audio signals to generate a modulated output signal on the carrier signal, the generation of the modulated output signal depending on selectably variable operating parameters of the modulating means;

control means coupled to the oscillator means and to the modulating means, for receiving a mode select signal and for selecting the frequency of the carrier signal by controlling the level of the frequency control signal and for selecting predetermined values for the variable operating parameters of the modulating means in dependence on the mode select signal, wherein the control means comprises:

data storage means for storing a different set of data for each of the plurality of modes of operation, each set comprising information representing the frequency of the carrier signal and the predetermined values for the variable operating parameters of the modulating means; and a control bus which couples the data storage means to the oscillator means and the modulating means, wherein the control bus in response to the mode select signal communicates the selected set of signals representative of the carrier signal frequency and the predetermined values to the oscillator means and the modulating means respectively, whereby the modulated output signal is generated in accordance with one of the plurality of modes of operation.

9. A modulator circuit for a video system, the modulator circuit being selectably operable in any one of a plurality of modes of operation corresponding to different video standards, and comprising:

oscillator means for generating a carrier signal having a selectably variable frequency;

modulating means comprising:

an audio modulator coupled to an audio input which receives an audio signal and having audio oscillator means for generating an audio carrier signal, the audio modulator using the received audio signal to modulate the audio carrier signal to provide a modulated audio signal, and a RF modulator coupled to a video input which receives a video signal and to the audio modulator, the RF modulator using the video signal and modulated audio signal to modulate the carrier signal to generate a modulated output signal on the carrier signal, the generation of the modulated output signal depending on selectably variable operating parameters of the modulating means;

control means coupled to the oscillator means and to the modulating means, for receiving a-mode select signal and for selecting the frequency of the carrier signal and for selecting predetermined values for the variable operating parameters of the modulating means in dependence on the mode select signal, wherein the control means comprises:

data storage means for storing a different set of data for each of the plurality of modes of operation, each set comprising information representing the frequency of the carrier signal and the predetermined values for the variable operating parameters of the modulating means; and a control bus which couples the data storage means to the oscillator means and the modulating means, wherein the control bus in response to the mode select signal communicates the selected set of signals representative of the carrier signal frequency and the predetermined values to the oscillator means and the modulating means respectively, whereby the modulated output signal is generated in accordance with one of the plurality of modes of operation.

10. A modulator circuit according to claim 9 wherein the audio modulator comprises a FM circuit and an AM circuit, the control means selecting either one of the FM or AM circuits in dependence on the selected mode of operation so as to provide either an FM modulated audio signal or an AM modulated audio signal.

11. A modulator circuit according to claim 9 wherein the oscillator means comprises a PLL for generating the audio carrier signal having a selectably variable frequency, and wherein the frequency of the audio carrier signal is selected by the control means in dependence on the selected mode of operation.

* * * * *